United States Patent [19]
Makino

[11] Patent Number: 6,144,603
[45] Date of Patent: Nov. 7, 2000

[54] SEMICONDUCTOR MEMORY DEVICE

[75] Inventor: Tatsushi Makino, Tokyo, Japan

[73] Assignee: NEC Corporation, Tokyo, Japan

[21] Appl. No.: 09/359,914

[22] Filed: Jul. 26, 1999

[30] Foreign Application Priority Data

Jul. 24, 1998 [JP] Japan .................................. 10-209142

[51] Int. Cl.⁷ .................................................. G11C 7/00
[52] U.S. Cl. ............................ 365/205; 365/207; 365/208
[58] Field of Search .................................... 365/205, 207, 365/208, 190

[56] References Cited

U.S. PATENT DOCUMENTS 5,566,116 10/1996 Kang ......................................... 365/205
5,930,190 7/1999 Hayano et al. ........................... 365/205
5,970,007 10/1999 Shiratake .................................. 365/207

*Primary Examiner*—Trong Phan
*Attorney, Agent, or Firm*—Young & Thompson

[57] ABSTRACT

A semiconductor memory device capable of over-drive sense operation to commence re-store to a memory cell immediately after the sense operation for satisfying a time specification for high level time period of the RASB signal, is provided a transfer gate or ON-OFF control in connection between bit lines in a memory cell side and bit lines in a sense amplifier side and a sense amplifier connected to I/O buses through a transistor operating under ON-OFF control in accordance with column selecting signal, and an amplifier is provided with a p-channel transistor connected to bit lines in the memory cell side.

11 Claims, 6 Drawing Sheets

SEMICONDUCTOR MEMORY DEVICE

BACKGROUND OF THE INVENTION

The present invention relates to a semiconductor memory device, and more particularly to a semiconductor memory device provided with a sense amplifier circuit suitable for an over-drive sense system.

DESCRIPTION OF THE RELATED ART

As, in recent years, a high integration of the semiconductor memory device has been progressed, the number of memory cells connected to one memory cell data amplification circuit (sense amplifier) has also been increased, whereby capacitance of bit lines (digit lines) connecting the memory cells and the sense amplifier has been intended to be increased.

The increase in capacitance of the bit lines causes increases in current consumed in sense operation, for which reason in order to satisfy the specification of the consumed current, it is required to voltage for driving the bit lines.

In view of the scale down in process, a reduction in voltage of the bit line is essential for improvement in reliability of withstand voltage against reduction in thickness of the memory cell capacitive film.

There are various problems in realizing to drive the bit lines with low voltage. Particularly, short channel effects make it difficult to do a large reduction in threshold voltage of the transistor along the scale down in process.

What the threshold voltage of the sense amplifier transistor is relatively large to a bit line voltage causes deterioration in sense speed and no sense operation due to insufficient gate-source voltage Vgs of the transistor.

As a prior art technique for solving this problem, an over-drive sense technique has been known, wherein a source voltage of the p-channel transistors forming the sense amplifier is increased to a higher voltage than a final high level of the bit line for sense operation. Typical structure will be described with reference to FIGS. 4, 5 and 6.

FIG. 4 is a view illustrative of a circuit configuration of a sense amplifier region of a conventional over-drive sense semiconductor memory device.

In FIG. 4, WL0 is a gate line (word line) of a transistor (N4-9) connecting a memory cell of a memory cell portion 0 to a bit line. Transistors N4-5 and N4-6 are switches (n-channel transfer gates) connecting bit line pair (DT/DN) of the memory cell region to bit line pair (ST/SN) of the sense amplifier region, and ON-OFF control is made by TG0 signal.

Gate and drain are cross-connected to bit line pair (ST/SN) and sources are commonly connected to a signal line SAP commonly used for a plurality of sense amplifiers. A CMOS sense amplifier comprises a pair of p-channel transistors P4- and P4-2 and a pair of n-channel transistors N4- and N4-2, where gates and drains are cross-connected to the bit line pair (ST/SN) and sources are connected to the signal line SAN commonly used for the plural sense amplifiers. N-channel transistors N4-3 and N4-4 have gates connected with YSW signals (column switch or column selecting signal) selected in accordance with a column address. In YSW signal activation, data of the bit line pair (ST/SN) amplified by the CMOS sense amplifier are transferred into complementary I/O bus IO, and IOB.

WL1 is a gate line (word line) of a transistor (N4-8) connecting a memory cell of the memory cell portion 1 to a bit line. Transistors N4-7 and N4-8 are switches connecting the bit line pair of the memory cell region to the bit line pair (ST/SN) of the sense amplifier region. The switch ON-OFF control is made in accordance with TG1 signal.

One of the functions of the control signals TG0 and TG1 is to control an active plate to be sensed. In a previous stage to activation of the word line, any of the TG signals is dropped to ground level. Before the selection of the cell of the memory cell portion 0, gate voltages of the transistors N4-7 and N4-8 forming the transfer gates are set low level to turn the transistors N4-7 and N4-8 OFF for disconnecting the bit line of the memory cell portion 1 from the bit line of the sense amplifier portion.

For example, for selecting the memory cell portion 0, the TG1 signal becomes GND level before the word line WL0 is activated. For selecting the memory cell portion 1, the TG0 signal becomes GND level before the word line WL1 is activated.

The over-drive sense system will be described with reference to FIG. 5.

Before a time T5-0, RASB (Row Address Strobe Bar) signal signals as the basic signals for row are made into low level. Thereafter, the control signal TG1 is made into GND state. Bit lines (DT/DN, ST/SN) and SAP and SAN signals are changed from an equalize state at HVCC potential, whereby the word line WL0 is activated at T5-0, to generate a slight potential difference between the bit lines in accordance with the data of the memory cell, At T5-1, the control signal TG0 is dropped to GND whilst SAP and SAN are activated for sense operations. At this time, the potential of the SAP is risen to a potential of a VINTS2.

At T5-2, the bit lines (ST/SN) in the sense amplifier are amplified for completion of the sense operation.

Thereafter, at T5-3, the control signal TG0 is returned back to active state to re-write (re-store) bit lines of the memory cell side.

At this time, the signal SAP is dropped in potential from VINTS2 to VINTS1 so that the memory cell operates to re-store at VINTS1.

In the sense amplifier operation, the SAP is set at higher voltage VINTS2 than the highest voltage VINTS1 of the bit lines to realize the high speed sense operation even the bit lines of the memory cell are not increased to VINTS1 level for suppression in consumed current in over-drive operation.

The amplified data are then transferred to the IO bus pair IO and IOB by activation of the YSW signal selected by a column address. The activation of the YSW is allowed after a time T5-2 having amplified the bit lines (ST/SN) in the sense amplifier.

FIG. 5(c) is illustrative of waveforms of YSW and IO and IOB. Activation of column switch YSW causes a discharge of one of the IO buss IO and IOB pre-charged at a predetermined potential through the n-channel transistor to generate a potential difference between the the IO buss IO and IOB.

A speed of generation of the potential difference between the IO buss IO and IOB is an important factor for characteristic of the read out operation of the device. The factor deciding this speed is a gate-source voltage Vgs of the n-channel transistor (N4-2) of the sense amplifier.

At the times T5-2 and T5-3 having been completed sense operation, over-sense operation is executing, for which reason the gate-source voltage Vgs of the n-channel transistor (N4-2) is large, and a generation speed of the potential difference between the IO buses IO/IOB due to activation of the YSW signal. After the control signal TG0 has been activated at the time T5-3, at a time T5-4, capacitance of bit lines (DT/DN) in the memory cell side not yet amplified are effective to the bit lines ST/SN of the sense amplifier side and further the source common line SAP is dropped in potential from VINTS2 to VINTS1, for which reason the potential difference of the bit lines ST/SN of the sense amplifier side is lost, whereby a potential of a High side node ST in the bit line is made small and the gate-source voltage of the transistor N4-2 of the sense amplifier is reduced.

In the conventional semiconductor memory device, there is a problem in that at time T5-4 in FIG. 5, activation of the column selecting signal YSW causes a remarkable reduction in generation speed of the potential difference between the IO buses IO/OB.

Further, if after the sense operation, a time has passed from TG activation, and then bit lines have an amplitude between VINTS1 and GND at T5-5, and if the VINTS1 is extremely low voltage such as 1.2V to 1.5V, then the generation speed of the potential difference between the IO buses IO/OB due to the activation of the signal YSW is slow as compared to that in activation of the column selecting signal YSW at T5-2, and T5-3, whereby read out seed is delayed.

As a measure for solving this problem, there is a control as shown in timing chart of FIG. 6.

With reference to FIG. 6, until the sense operation is completed to the bit lines at T6-2, the operation is the same timing as shown in FIG. 5. The later TG activation is carried out after the RASB signal is risen at T6-3 and column access due to TSW activation is inhibited.

In accordance with this control, during a column access time period between T6-2 to T6-3, high side bit line (ST) in the sense amplifier is VINTS2 level, for which reason the gate-source voltage Vgs of the n-channel transistor N4-2 of the sense amplifier is kept high potential so that the generation speed of the potential difference between the IO/IOB buses due to the YSW activation may be kept high independently from the YSW activation timing.

In this structure, however, it is necessary re-store the bit lines (DT/DN) of the memory cell portion after T6-3, whereby it is difficult to satisfy the pre-charge specification of the row that the RASB signal is kept high level T6-3 to T6-5.

If the column selecting signal YSW is activated immediately after the control signal TG activation after the bit lines (ST/SN) in the sense amplifier have been sensed, the generation speed of the potential difference between the IO/IOB buses is delayed whereby the read out time is thus delayed. If after the sense operation, a time has passed from TG activation, and then bit lines have an amplitude between VINTS1 and GND at T5-5, and if the VINTS1 is extremely low voltage such as 1.2V to 1.5V, then the generation speed of the potential difference between the IO buses IO/OB due to the activation of the signal YSW is slow as compared to that in activation of the column selecting signal YSW at T5-2, and T5-3, whereby read out seed is delayed.

In this structure, however, it is necessary re-store the bit lines (DT/DN) of the memory cell portion after T6-3, whereby it is difficult to satisfy the pre-charge specification of the row that the RASB signal is kept high level T6-3 to T6-5.

SUMMARY OF THE INVENTION

An object of the present invention is to solve the above problems and also provide a semiconductor memory device capable of over-drive sense operation to commence re-store to memory cell immediately after the sense operation for satisfying a time specification for high level time period of the RASB signal.

The present invention, in achieving the above object, provides a semiconductor memory device provided with a transfer gate or ON-OFF control in connection between bit lines in a memory cell side and bit lines in a sense amplifier side and a sense amplifier connected to I/O buses through a transistor operating under ON-OFF control in accordance with column selecting signal, and an amplifier is provided comprising a p-channel transistor connected to bit lines in the memory cell side.

BRIEF DESCRIPTION OF THE DRAWINGS

A brief description of the drawings follows.

Figure 1:
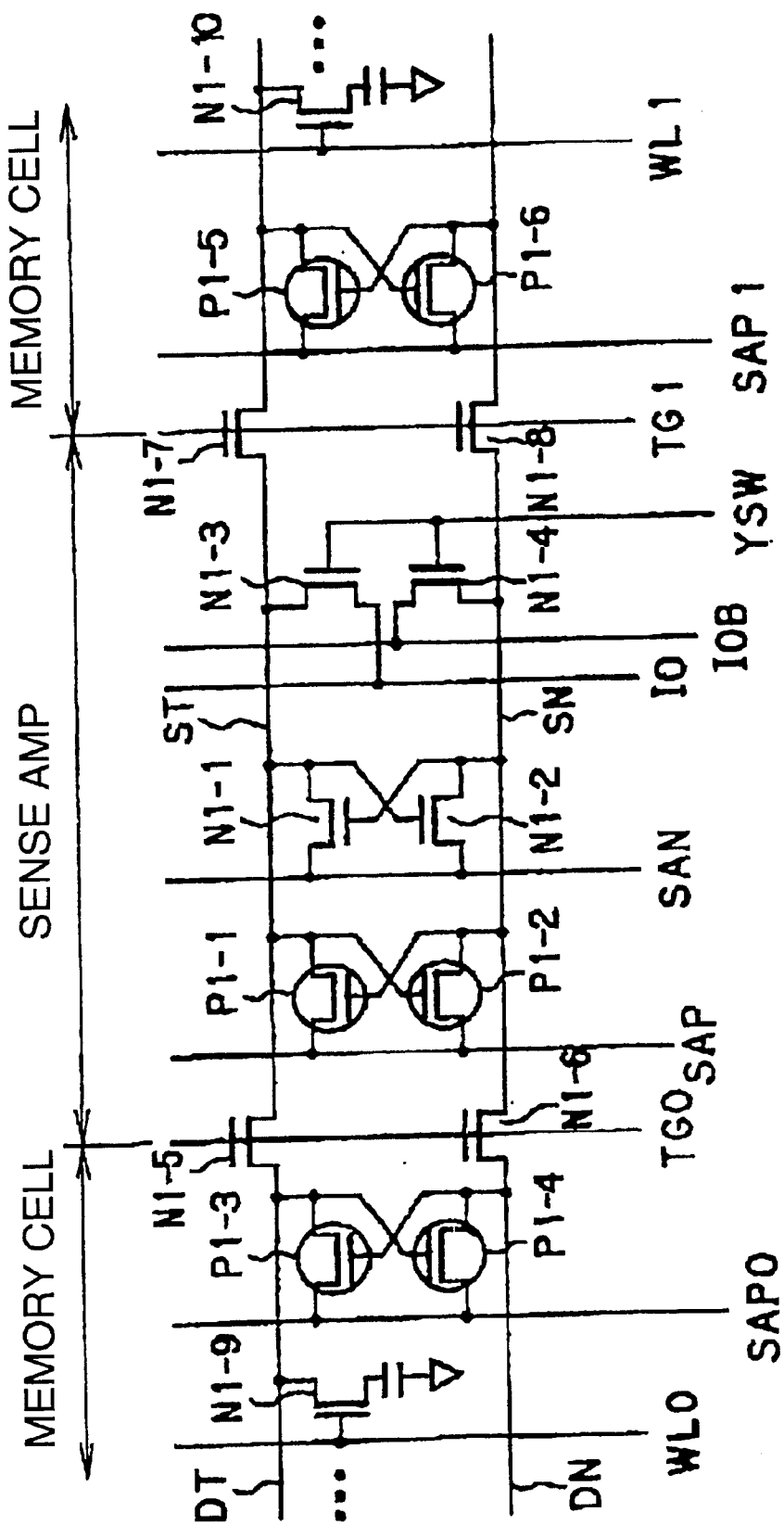
FIG. 1 is a view illustrative of a structure of one embodiment of the present invention.

In a group of sense amplifier circuits having CMOS sense amplifier circuits provided with transfer switches or separating bit lines in memory cell portion and in amplifier portion, bit lines in a side of the memory cell more than the transfer switch are provided with p-channel transistor amplifiers (P1-3 and P1-4 in FIG. 1).

In accordance with another embodiment of the present invention, a source potential of a p-channel transistor of the CMOS sense amplifier is set different from a source potential of the p-channel transistor amplifier in the memory cell side.

FIG. 1 is a view illustrative of one embodiment of a semiconductor memory device of the present invention, wherein a sense amplifier portion of a bit line circuit is shown. In FIG. 1, the same constitutional elements as shown in FIG. 4 are labeled with the same reference numbers.

Figure 4:
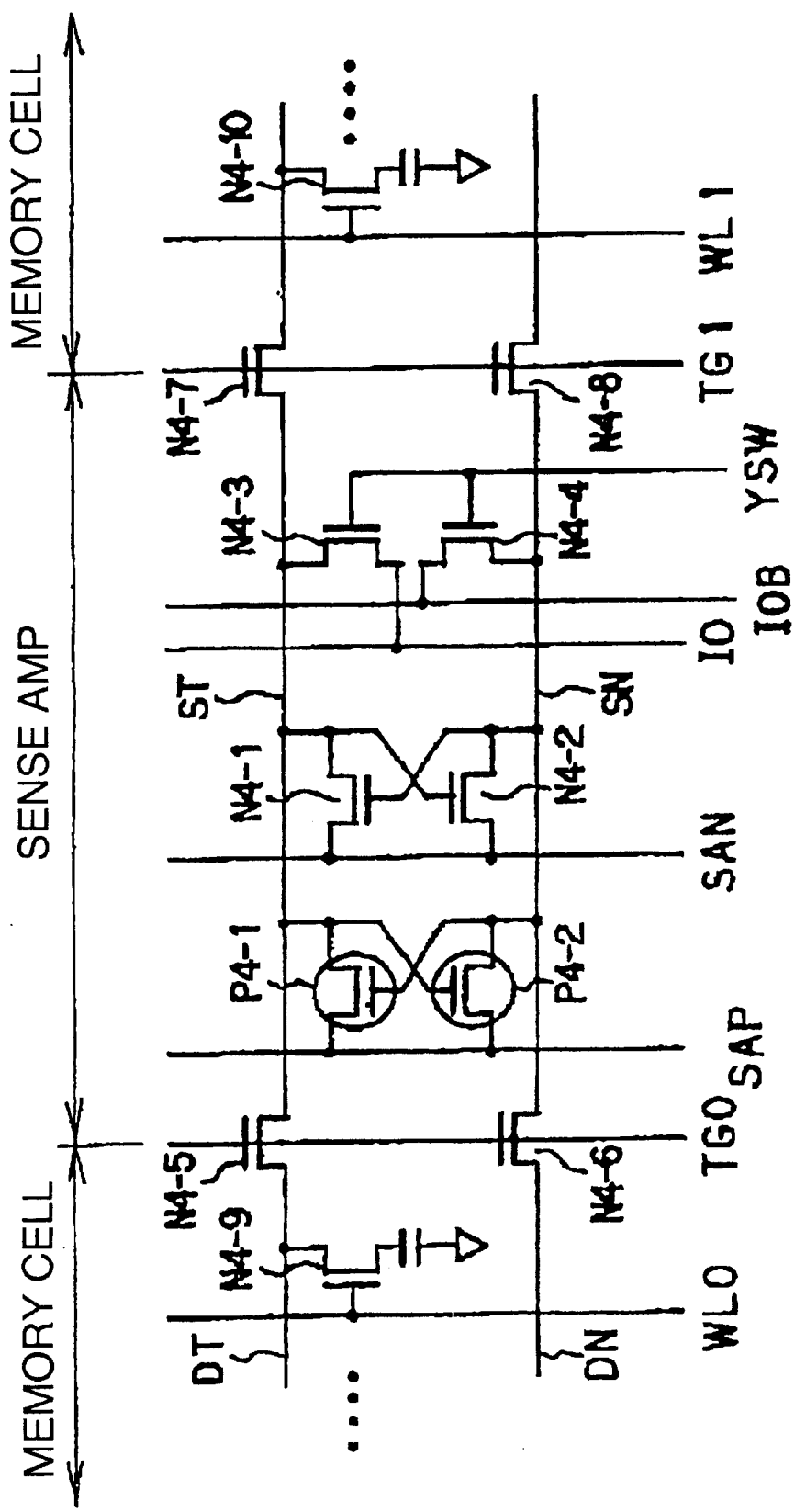
FIG. 4 is a view illustrative of a structure of the conventional semiconductor memory device.
Figure 5:
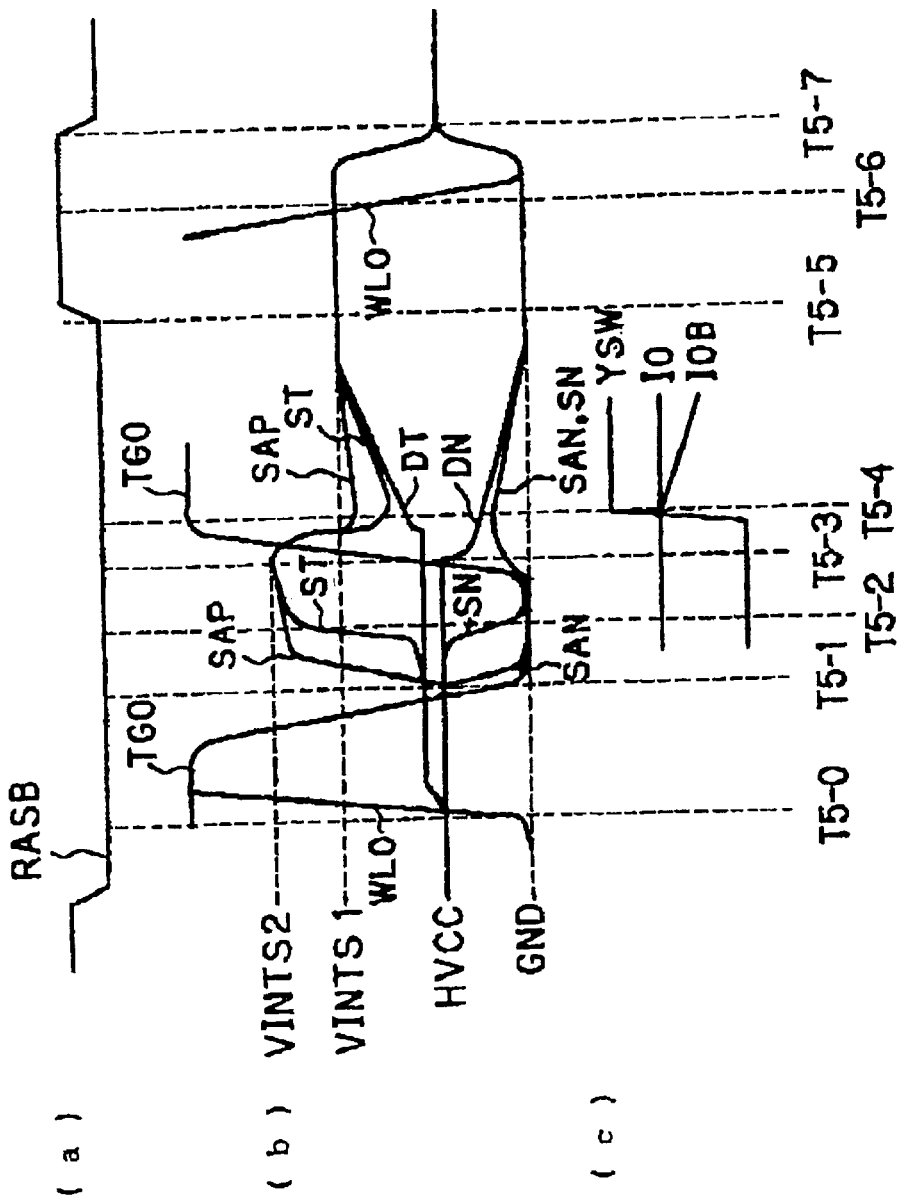
FIG. 5 is a timing chart explaining the control of the conventional semiconductor memory device.
Figure 6:
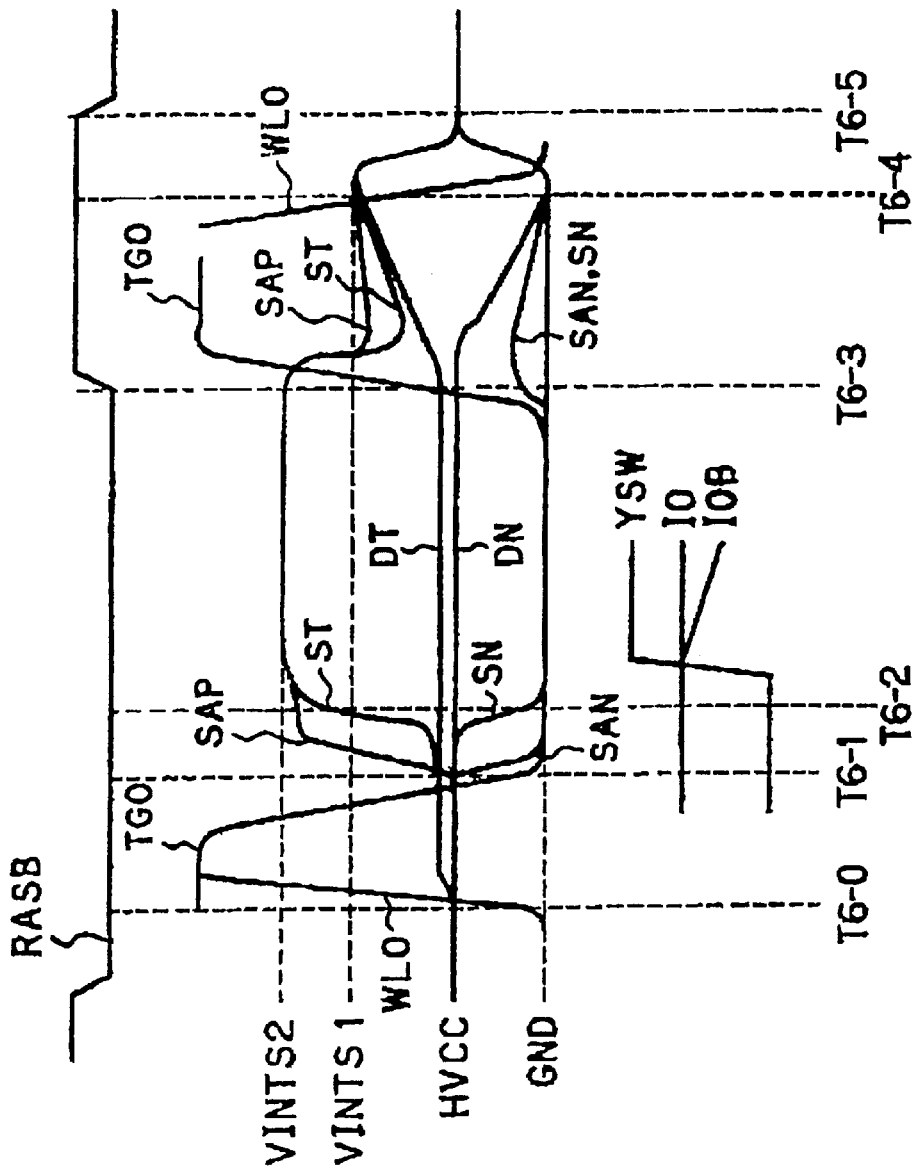
FIG. 6 is a timing chart explaining the control operation of the conventional semiconductor memory device.

In the first embodiment of the present invention, different from the structure shown in FIG. 4 is that p-channel transistor amplifiers (P1-3, P1-4, P1-5 and P1-6) to CMOS sense amplifiers (N1-1, N1-2, P1-1, and P1-2) in TG0 and TG1 memory cell side between transfer gates (N1-5, N1-6, N1-7 and N1-8) controlled by the two control signals TG0 and TG1.

In the prior art, after the sense operation has been completed to the bit lines (ST/SN) of the sense amplifier portion, gate potentials (potentials of the control signals TG0 and TG1) are activated to the necessary potentials for re-storing both the paired bit lines (DT/DN) in the memory cell side. In accordance with the present invention, however, the control signals of the transfer gates are controlled in activation voltage so as to re-store only the lower potential one of the bit lines, whilst re-storing the high potential bit line is carried out by the p-channel transistor connected to the bit lines (DT/DN) in the memory cell side.

Accordingly, the potential of the high potential bit line in the sense amplifier may be kept in a potential for over-drive even after the transfer gates have been activated, for which reason no delay in generation speed of the potential difference between the IO buses IO/IOB due to the column selecting signal is caused. Further, it is possible to commence re-storing immediately after the sense operation.

Figure 2:
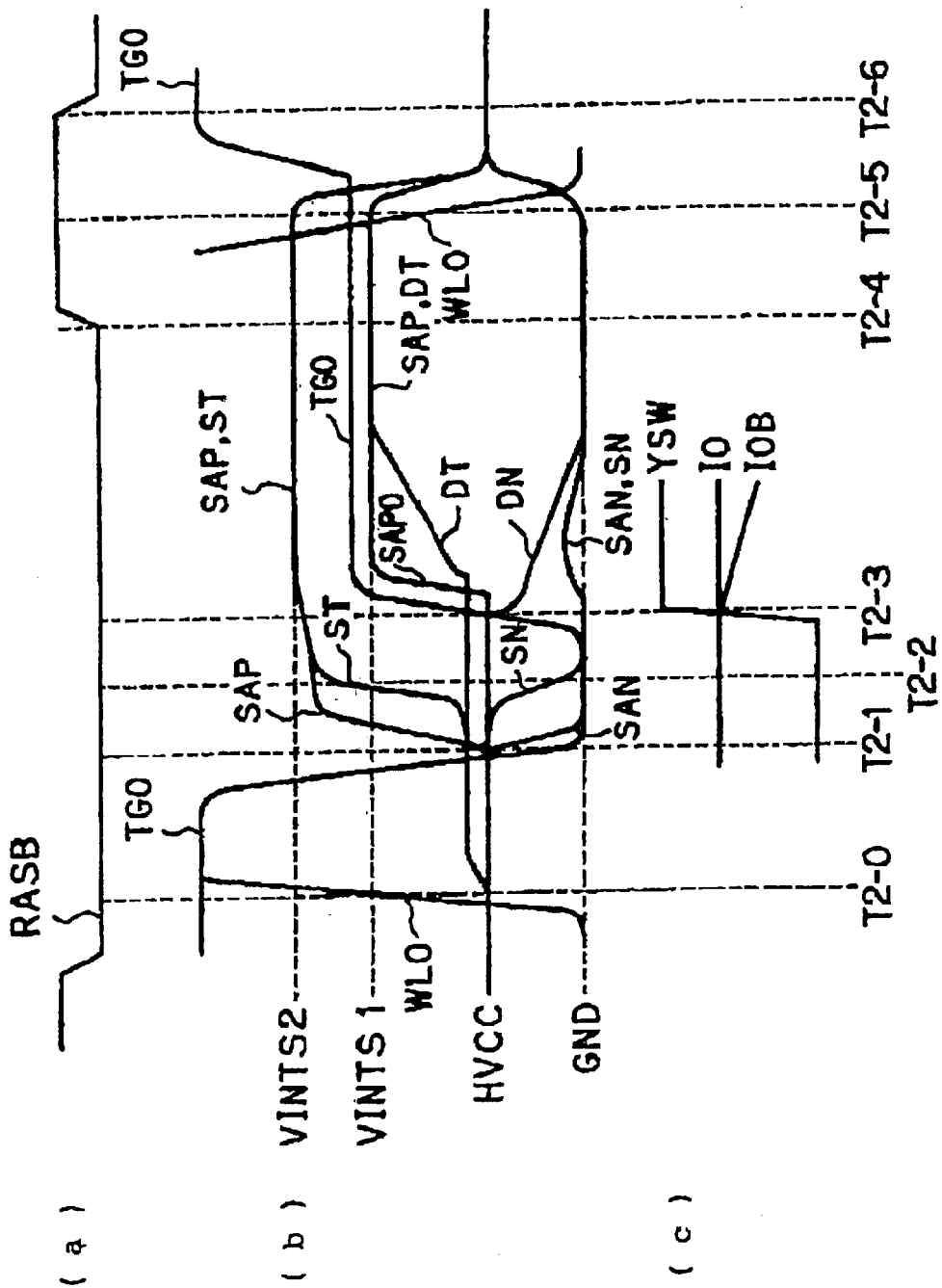
FIG. 2 is a timing chart explaining the control in one embodiment of the present invention.

FIG. 2 is a timing chart of operation in one embodiment of the present invention.

Before T2-0, the control signal TG1 is GND state, and the bit line pair (DT/DN) and the SAP and SAN signals are equalized at the potential of HVCC.

At T2-0, the word line WL0 is activated to generate a slight potential difference between the bit lines (DT/DN) due to data of memory cell.

At T2-1, the control signal TG0 is dropped to GND, and the SAP and SAN are activated for sense operation. At this time, the potential of SAP is increased up to VINTS2.

At T2-2, the bit lines (ST/SN) of the sense amplifier are amplified for completion of the sense operation.

The foregoing operations are the same as in the prior art of FIG. 4.

At T2-3, the activation of the control signal TG of the transfer gate is different in activation potential from the prior art.

In the prior art, activation to the control signal TG causes high and low potential bit lines of the memory cell side to have individual voltages for re-storing or to have VINTS1+NVt or more (NVt is a threshold voltage of the n-channel transistor). By contrast, in accordance with the present invention, the activation potential of the TG is so set that the high potential bit line of the memory cell side is not re-stored whilst the low potential bit line is re-stored, namely, at not less than Nvt and not more than HVCC+NVt.

The low bit line (SN) of the sense amplifier side and the low bit line (DN) in the memory cell side are made connected to each other upon activation of the TG0, whereby restoring the memory cell. The high bit line (ST) of the sense amplifier side and the high bit line (DT) in the memory cell side are not made connected to each other.

Since high side data are not re-stored to the memory cell without any further operation, at T2-3, at the equivalent time to the TG activation, the source SAP0 of the p-channel amplifier added in the embodiment is activated from HVCC to VINTS1 and re-store up to VINTS1.

A different point from the conventional system is that after T2-3, it is possible to keep the activation level VINTS2 of the SAP signal.

Since the TG activation potential is controlled by the configuration described above, the bit line (ST) in the sense amplifier portion and the bit line (DT) in the memory cell portion are not made connected to each other and completely separate controls thereto are possible.

Thus, in accordance with this embodiment, the SAP may always be kept at VINTS2 from the sense operation commencement to the word line re-set namely during column operations by activated YSW signal. It is possible to re-store the memory cell immediately after the sense operation has been completed.

The foregoing descriptions are in a system where TG signal is dropped to GND level immediately before the sense operation and then after sense operation has been completed, then the TG is activated (this will be refereed to as "TG clocking sense system". The present invention is applicable without limiting to this TG clocking sense system.

Figure 3:
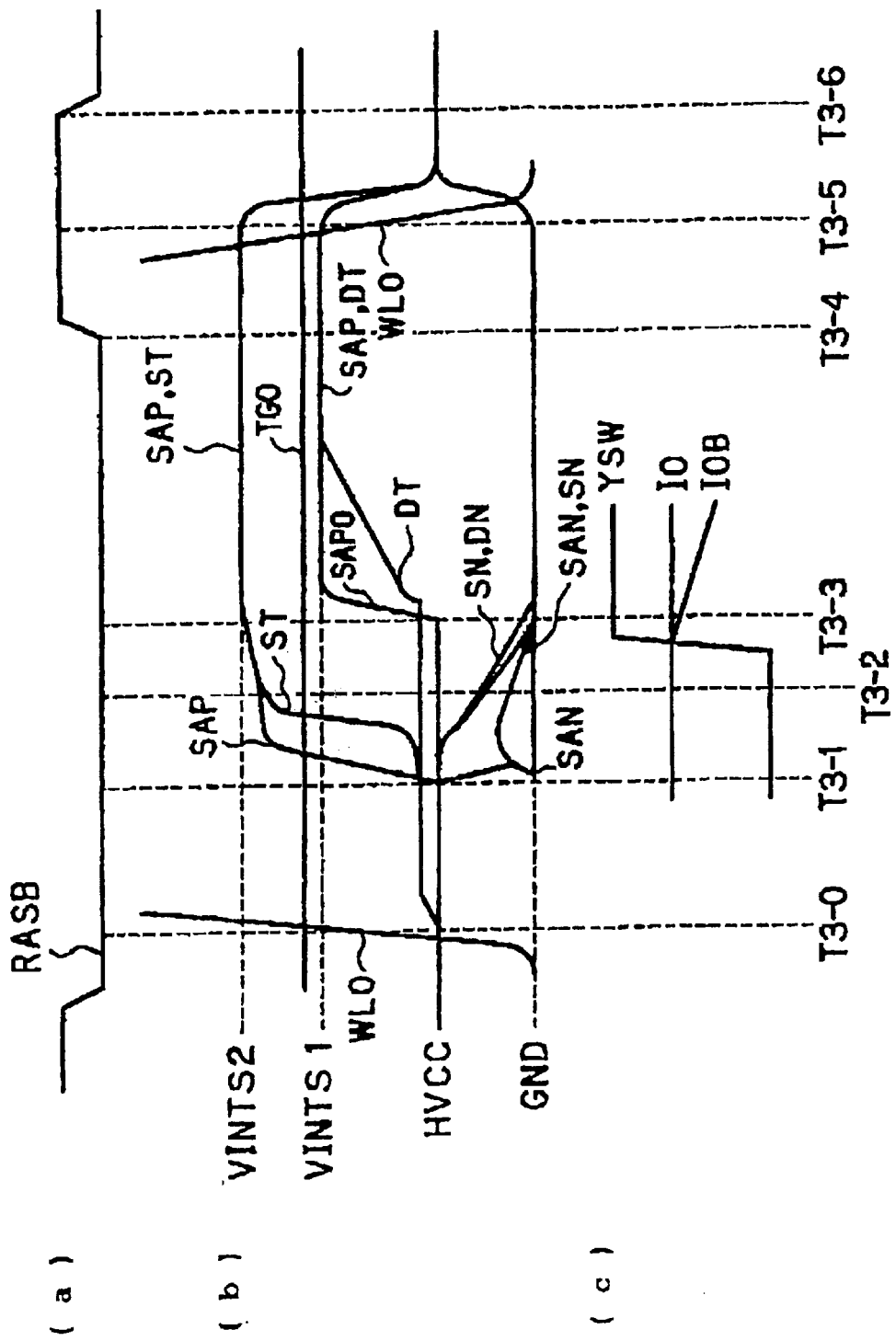
FIG. 3 is a timing chart explaining the control operation in second embodiment of the present invention.

FIG. 3 is a timing chart of operation in second embodiment of the present invention. The structure of this second embodiment in the same as shown in FIG. 1.

Before T3-0, the control signal TG1 is GND state, and the bit line pair (DT/DN) and the SAP and SAN signals are equalized at the potential of HVCC.

At T3-0, the word line WL0 is activated to generate a slight potential difference between the bit lines (DT/DN) due to data of memory cell.

A different point from the control system shown in FIG. 2 is in potential of the control signal TG0 of the transfer gates N1-5 and N1-6.

In this second embodiment of the present invention, the control signal TG0 is kept constant in potential during Row operation. This potential is not less than HVCC+α+Nvt and not more than VINTS1+Nvt, where α is the potential difference between the bit line pair generated by the word line activation.

At T3-1, the SAP and SAN are activated for sense operation. The sense operations to the bit lines (ST/SN) in the sense amplifier are commenced and at T3-2, the sense operation is completed.

Since the low bit line (DN) in the memory cell side is completely connected to the bit line (SN) in the sense amplifier, the potential is dropped along the SN signal. The high bit line (DT) is connected to the bit line (ST) in the sense amplifier in the initial state. Since the gate potential of TG0 is set low, the potential is increased and the connection between the both is disconnected.

Accordingly, the bit line (ST) in the sense amplifier is increased to the VINTS2, whilst the bit line (DT) in the memory cell is limited at TG0 voltage−NVt. At T3-3, the source SAP0 of the p-channel transistor is activated from HVCC to VINTS1 and re-store the bit line (DT) in the memory cell side VINTS1.

Through the above control, in the second embodiment of the present invention, similarly to the control of the above embodiment, high bit line in the sense amplifier side and the high bit line in the memory cell side may be set in potential independently after the sense amplifier has been completed and until the word line is inactivated, whereby SAP is kept at VINTS2. It is possible to re-store the memory cell immediately after the sense operation.

As described above, in accordance with the present invention, in order to satisfy the specification of the row system pre-charge time (namely tRP spec), re-write (re-store) to the memory cell after sense may be commenced immediately after the sense operation to control the gate potential of the transfer gate whereby high bit line potentials are kept different from each other between the memory cell side and the sense amplifier side. It is possible to solve the conventional problems such as a problem that the generation speed of the potential difference between the IO buses IO/IOB due to the TSW activation immediately after the TG activation is remarkably reduced and a problem that the generation speed of the potential difference between the IO buses IO/IOB independent from the TSW activation timing is reduced when the VINTS level is lowered.

REFERENCE NUMBER SUMMARY

DT, DN: memory cell bit lines
IO, IOB; IO buses
N1-1, N1-2, N1-3, N1-4, N1-5, N1-6, N1-7, N1-8; n-channel transistors
N1-9, N1-9: memory cell transistors
P1-1, P1-2, P1-3, P1-4, P1-5, P1-6; p-channel transistors
SAN; source line of the n-channel transistor of the sense amplifier;

SAP; source line of the p-channel transistor of the sense amplifier;

SAP0; source line of the p-channel transistor in the memory cell portion 1;

ST, SN; bit lines of the sense amplifier side

TG0, TG1; transfer gate control signals

WL0, WL1; word lines

What is claimed is:

1. A semiconductor memory device comprising:

a sense amplifier section connected via a transfer gate to a first memory cell section, said transfer gate serving as a switch for switching connection and disconnection between said first memory cell section and said sense amplifier section, said transfer gate having a first switch positioned to connect a low potential bit line of said sense amplifier section with a low potential bit line of said first memory cell section and a second switch positioned to connect a high potential bit line of said sense amplifier section with a high potential bit line of said first memory cell section; and an amplifier connected to said low and high potential bit lines of said first memory cell section and positioned intermediate said first memory cell section and said transfer gate, wherein control signals of said first and second switch, after completion of a sensing operation, are controlled in activation voltage to restore only said low potential bit line of said first memory cell section and restoring said high potential bit line of said first memory cell section is provided by said amplifier.

2. The semiconductor memory device of claim 1, wherein said amplifier comprises a pair of p-channel transistors having drains connected to said bit lines of said memory cell section, gates connected cross to each other and sources connected to a first common source.

3. The semiconductor memory device of claim 2, wherein said sense amplifier section comprises a pair of p-channel transistors having drains connected to bit lines of said sense amplifier section, gates connected cross to each other and sources connected to a second common source; and a pair of n-channel transistors having drains connected to said bit lines of said sense amplifier section, gates connected cross to each other and sources connected to a third common source.

4. The semiconductor memory device of claim 3, wherein said first transfer gate is inactive immediately before a sense operation and then activated after said sense operation.

5. A semiconductor memory device comprising:

bit lines of a memory cell portion;

bit lines of a sense amplifier portion;

a switch providing ON-OFF control in connection between one of said bit lines of said memory cell portion and a corresponding one of said bit lines of said sense amplifier portion;

a column selecting line connected to said switch providing ON-OFF control of said switch in connection of said bit lines of said sense amplifier portion to an I/O bus through said switch; and an amplifier connected to said bit lines of said memory cell portion and to each of a pair of transistors of an associated transfer gate, said amplifier being positioned on said memory cell portion side of said transfer gate.

6. The semiconductor memory device of claim 5, wherein said amplifier comprises a pair of p-channel transistors having drains connected to said bit lines of said memory cell portion, gates connected cross to each other and sources connected to a common source line.

7. The semiconductor memory device of claim 6, wherein said sense amplifier portion comprises a pair of p-channel transistors having drains connected to said bit lines of said sense amplifier section, gates connected cross to each other and sources connected to a second common source; and a pair of n-channel transistors having drains connected to said bit lines of said sense amplifier portion, gates connected cross to each other and sources connected to a third common source.

8. The semiconductor memory device of claim 7, wherein potentials are independently set to said p-channel transistors of said sense amplifier and to said p-channel transistors of said amplifier connected to said bit lines of said memory cell portion.

9. The semiconductor memory device of claim 5, wherein a potential of a control terminal of said transfer gate is held constant during a time period of row-system operation.

10. A semiconductor memory device comprising:

a transfer gate provided between bit lines of a memory cell portion and bit lines of a sense amplifier portion;

a control signal line connected to said transfer gate, said transfer gate providing ON-OFF control in accordance with a control signal provided on said control signal line for connection and disconnection between said memory cell portion and said sense amplifier portion, said sense amplifier portion comprising a CMOS sense amplifier with bit lines connected to an I/O bus through transistors operating under ON-OFF control from a column selecting signal line; and an amplifier comprising a pair of p-channel transistors having drains connected to paired bit lines on a memory cell portion side, gates connected cross to each other and sources connected to a common source line, wherein after a sense operation to said bit lines in said sense amplifier portion, an activation potential of said transfer gate becomes a potential for restoring only a lower potential one of said bit lines of said memory cell portion and said p-channel transistor amplifier provides a restore signal of said higher potential one of said bit lines of said memory cell portion.

11. The semiconductor memory device of claim 10, wherein said transfer gate is inactive immediately before a sense operation and is activated after said sense operation.

* * * * *